(12) United States Patent
Chang et al.

(10) Patent No.: US 11,967,558 B2
(45) Date of Patent: Apr. 23, 2024

(54) WAFER STACKING STRUCTURE AND MANUFACTURING METHOD THEREOF

(71) Applicants: Powerchip Semiconductor Manufacturing Corporation, Hsinchu (TW); Jium-Ming Lin, Hsinchu (TW)

(72) Inventors: Shou-Zen Chang, Hsinchu (TW); Chun-Lin Lu, Hsinchu (TW); Jium-Ming Lin, Hsinchu (TW)

(73) Assignees: Powerchip Semiconductor Manufacturing Corporation, Hsinchu (TW); Jium-Ming Lin, Hsinchu (TW)

(*) Notice: Subject to any disclaimer, the term of this patent is extended or adjusted under 35 U.S.C. 154(b) by 173 days.

(21) Appl. No.: 17/396,776

(22) Filed: Aug. 9, 2021

(65) Prior Publication Data
US 2022/0406722 A1 Dec. 22, 2022

(30) Foreign Application Priority Data
Jun. 17, 2021 (TW) .................. 110122035

(51) Int. Cl.
| | |
|---|---|
| H01L 23/538 | (2006.01) |
| H01L 21/48 | (2006.01) |
| H01L 23/00 | (2006.01) |
| H01L 23/552 | (2006.01) |
| H01L 25/00 | (2006.01) |
| H01L 25/10 | (2006.01) |
| H01Q 1/22 | (2006.01) |

(52) U.S. Cl.
CPC ...... *H01L 23/5383* (2013.01); *H01L 21/4857* (2013.01); *H01L 23/552* (2013.01); *H01L 24/16* (2013.01); *H01L 24/73* (2013.01); *H01L 24/92* (2013.01); *H01L 25/105* (2013.01); *H01L 25/50* (2013.01); *H01Q 1/22* (2013.01); *H01L 2224/16227* (2013.01); *H01L 2224/73103* (2013.01); *H01L 2224/9211* (2013.01)

(58) Field of Classification Search
CPC ....................... H01L 23/5383; H01L 21/4857; H01L 23/552
See application file for complete search history.

(56) References Cited

U.S. PATENT DOCUMENTS

| | | | |
|---|---|---|---|
| 7,056,807 B2 | 6/2006 | Kellar et al. | |
| 8,557,680 B2 | 10/2013 | Chandrasekaran et al. | |
| 10,043,769 B2 | 8/2018 | Shih et al. | |
| 2004/0014308 A1* | 1/2004 | Kellar .................. | H01L 25/50 257/E21.705 |

(Continued)

OTHER PUBLICATIONS

Office Action of Taiwan Counterpart Application, dated Feb. 10, 2022, pp. 1-6.

*Primary Examiner* — Errol V Fernandes
(74) *Attorney, Agent, or Firm* — JCIPRNET

(57) ABSTRACT

A wafer stack structure includes an interlayer, a first wafer, and a second wafer. The interlayer has a first surface and a second surface opposite to the first surface. The intermediate layer includes a dielectric material layer and a redistribution layer embedded in the dielectric material layer. The first wafer is disposed on the first surface of the interlayer. The second wafer is disposed on the second surface of the interlayer. The second wafer is electrically connected to the first wafer through the redistribution layer of the interlayer.

14 Claims, 7 Drawing Sheets

(56) References Cited

U.S. PATENT DOCUMENTS

| | | | | |
|---|---|---|---|---|
| 2007/0207592 A1* | 9/2007 | Lu | .......................... | H01L 24/83 |
| | | | | 438/455 |
| 2012/0043672 A1* | 2/2012 | Cho | ................. | H01L 23/49822 |
| | | | | 257/E23.06 |
| 2016/0009544 A1* | 1/2016 | Rothberg | ............... | H01L 24/94 |
| | | | | 257/737 |
| 2016/0190089 A1* | 6/2016 | Yu | .......................... | H01L 24/94 |
| | | | | 438/107 |
| 2018/0257927 A1* | 9/2018 | Rothberg | ............... | B81B 7/008 |
| 2019/0109086 A1* | 4/2019 | Li | .......................... | H01L 24/09 |
| 2019/0164924 A1* | 5/2019 | Li | .......................... | H01L 24/24 |
| 2020/0105720 A1* | 4/2020 | Yuan | ................ | H01L 21/02554 |
| 2021/0111122 A1 | 4/2021 | Liu | | |

* cited by examiner

WAFER STACKING STRUCTURE AND MANUFACTURING METHOD THEREOF

CROSS-REFERENCE TO RELATED APPLICATION

This application claims the priority benefit of Taiwan application serial no. 110122035, filed on Jun. 17, 2021. The entirety of the above-mentioned patent application is hereby incorporated by reference herein and made a part of this specification.

BACKGROUND

Technical Field

The disclosure relates to a wafer structure, and particularly to a wafer stacking structure and a manufacturing method thereof.

Description of Related Art

Generally speaking, a memory (e.g., random access memory, RAM) and a logic chip are arranged and integrated horizontally. Specifically, the memory and the logic chip are respectively bonded to a substrate through a solder bump or a solder ball in a flip-chip manner. Then, the memory and the logic chip may be electrically connected through in-plane routing within the substrate. However, such integration results in a long electrical transmission path between the memory and the logic chip, which leads to a large interconnection loss and a large package size.

SUMMARY

The disclosure provides a wafer stacking structure capable of shortening an electrical transmission path between first and second wafers to reduce power consumption.

The disclosure provides a manufacturing method of a wafer stacking structure capable of simplifying the manufacturing process or increasing manufacturing yield.

A wafer stacking structure according to an embodiment of the disclosure includes an interlayer, a first wafer, and a second wafer. The interlayer has a first surface and a second surface opposite to the first surface. The interlayer includes a dielectric material layer and a redistribution layer embedded in the dielectric material layer. The first wafer is disposed on the first surface of the interlayer. The second wafer is disposed on the second surface of the interlayer. The second wafer is electrically connected to the first wafer through the redistribution layer of the interlayer.

In an embodiment of the disclosure, the first wafer includes multiple first conductive contacts, and the second wafer includes multiple second conductive contacts. The first conductive contacts contact the redistribution layer. The second conductive contacts contact the redistribution layer.

In an embodiment of the disclosure, the first conductive contacts are columnar metals protruding from the first wafer, and the second conductive contacts are columnar metals protruding from the second wafer.

In an embodiment of the disclosure, at least one of the first conductive contacts does not overlap with at least one of the second conductive contacts in a normal direction of the wafer stacking structure.

In an embodiment of the disclosure, the interlayer further includes multiple openings. The openings are disposed on the first surface and the second surface to expose the redistribution layer.

In an embodiment of the disclosure, the redistribution layer includes a first circuit layer, a second circuit layer, and multiple conductive vias. The first circuit layer contacts the first conductive contacts. The second circuit layer contacts the second conductive contacts. The conductive vias are electrically connected the first circuit layer and the second circuit layer In an embodiment of the disclosure, the second wafer, the interlayer and the first wafer overlap in a normal direction of the wafer stacking structure.

In an embodiment of the disclosure, a material of the first wafer and the second wafer described above is different from a material of the dielectric material layer In an embodiment of the disclosure, the material of the aforementioned dielectric material layer is an organic or inorganic dielectric material.

In an embodiment of the disclosure, the material of the aforementioned dielectric material layer is aluminium nitride, benzocyclobutene, polyimide, or Ajinomoto build-up film.

In an embodiment of the disclosure, the wafer stacking structure further includes a first adhesive layer and a second adhesive layer. The first adhesive layer is disposed between the first wafer and the first surface of the interlayer. The second adhesive layer is disposed between the second wafer and the second surface of the interlayer.

In an embodiment of the disclosure, the interlayer further includes a shielding structure and an antenna structure. The shielding structure is embedded in the interlayer to shield a radiation signal from the second wafer. The antenna structure is disposed on a side of the intermediate layer to transmit and/or receive a signal.

In an embodiment of the disclosure, the shielding structure is grounded. The shielding structure forms a common ground structure with the first wafer and the second wafer.

A manufacturing method of a wafer stacking structure according to an embodiment of the disclosure includes the following. An interlayer is provided. The interlayer has a first surface and a second surface opposite to the first surface. The interlayer includes a dielectric material layer and a redistribution layer embedded in the dielectric material layer. The first wafer is bonded to the first surface of the interlayer. The second wafer is bonded to the second surface of the interlayer, so that the second wafer is electrically connected to the first wafer through the redistribution layer of the interlayer.

In an embodiment of the disclosure, providing the interlayer includes the following. A wafer or glass substrate is provided. The interlayer is formed on the wafer or the glass substrate. The wafer or the glass substrate is removed to expose the second surface of the interlayer In an embodiment of the disclosure, bonding the first wafer to the first surface of the interlayer includes the following. Multiple openings are formed on the first surface of the interlayer to expose the redistribution layer. The first conductive contacts of the first wafer contact the redistribution layer through the openings.

In an embodiment of the disclosure, bonding the second wafer to the second surface of the interlayer includes the following. Multiple openings are formed on the second surface of the inter layer to expose the redistribution layer. The second conductive contacts of the second wafer contact the redistribution layer through the openings.

In an embodiment of the disclosure, the manufacturing method of the wafer stacking structure further includes the following. A first adhesive layer is formed between the first wafer and the first surface of the interlayer. A second adhesive layer is formed between the second wafer and the second surface of the interlayer.

Based on the aforementioned, in the wafer stacking structure and the manufacturing method of the wafer stacking structure according to the embodiments of the disclosure, the first wafer is disposed on the first surface of the interlayer, the second wafer is disposed on the second surface of the interlayer, and the second wafer is electrically connected to the first wafer through the redistribution layer of the interlayer. Therefore, the electrical transmission path between the first wafer and the second wafer can be shortened, the power consumption of the wafer stacking structure of the embodiments can be reduced, and the manufacturing process and the manufacturing yield according to the manufacturing method of the wafer stacking structure according to the embodiments can be respectively simplified and increased.

In order to make the aforementioned features and advantages of the disclosure more comprehensible, the following specific embodiments are described in detail in conjunction with the accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
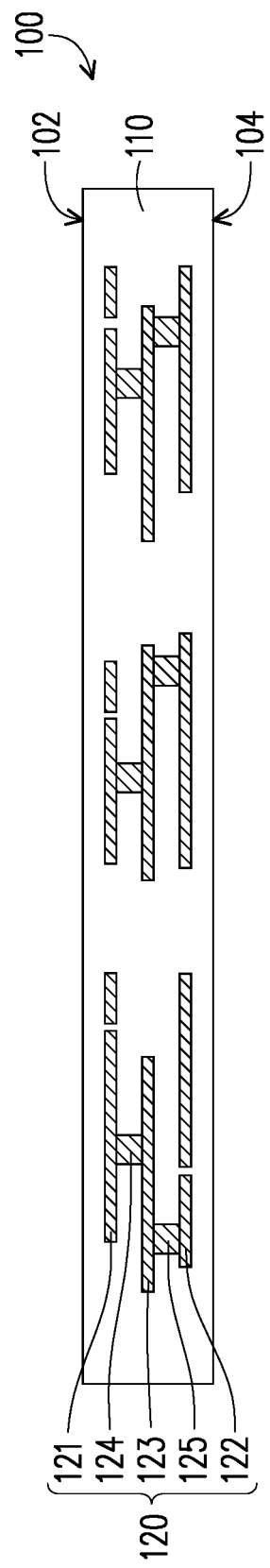
FIG. 1A to FIG. 1C are schematic cross-sectional views illustrating a method for manufacturing wafer stacking structure according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 1B:
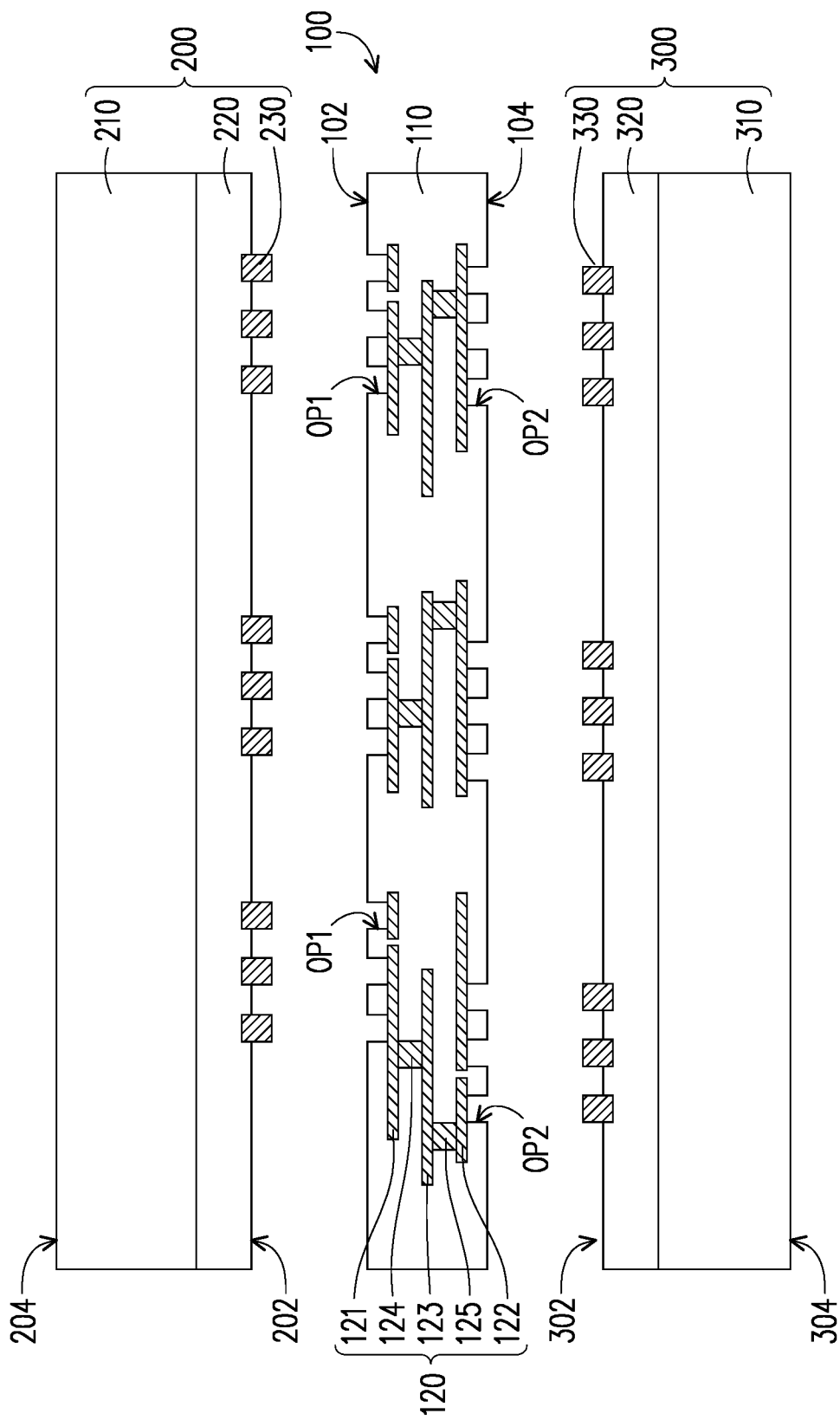
Figure 1C:
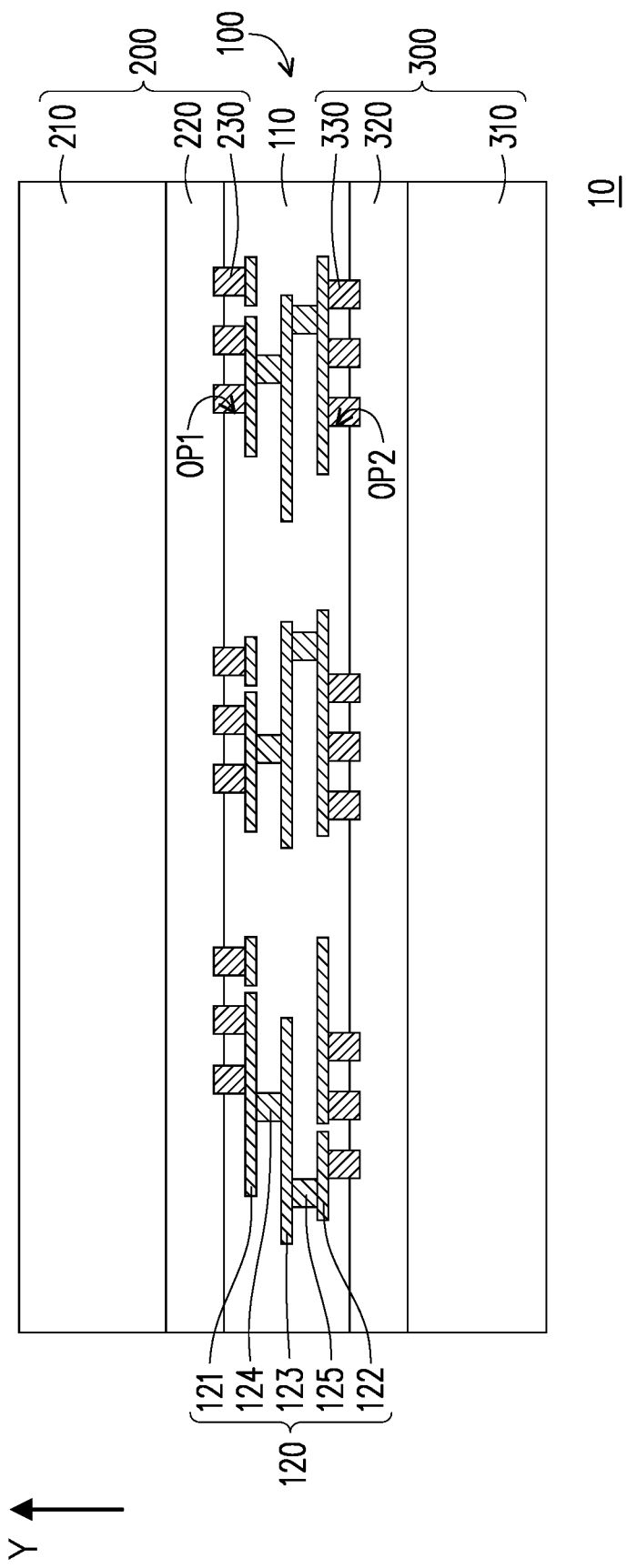

FIG. 1A to FIG. 1C are schematic cross-sectional views illustrating a method for manufacturing a wafer stacking structure according to an embodiment of the disclosure.

First, referring to FIG. 1A, an interlayer 100 is provided. Specifically, in this embodiment, the interlayer 100 has a first surface 102 and a second surface 104 opposite to the first surface 102, and the interlayer 100 includes a dielectric material layer 110 and a redistribution layer 120 is embedded in the dielectric material layer 110. In other words, the redistribution layer 120 may be embedded in the dielectric material layer 110 of the interlayer 100, but the disclosure is not limited thereto.

In this embodiment, the redistribution layer 120 may include a first circuit layer 121, a second circuit layer 122, a third circuit layer 123, and multiple conductive vias 124 and 125. The first circuit layer 121 and the second circuit layer 122 are respectively located on opposite sides of the third circuit layer 123. The first circuit layer 121 and the second circuit layer 122 are respectively adjacent to and do not directly contact the first surface 102 and the second surface 104 of the interlayer 100. The first circuit layer 121 is connected to the third circuit layer 123 through the conductive via 124, and the second circuit layer 122 is connected to the third circuit layer 123 through the conductive via 125. That is, the first circuit layer 121 may be electrically connected to the second circuit layer 122 through the conductive via 124, the third circuit layer 123, and the conductive via 125. Here, the materials of the first circuit layer 121, the second circuit layer 122, the third circuit layer 123, and the conductive vias 124 and 125 may be, for example, a metal conductive material such as copper or aluminium, but the disclosure is not limited to thereto.

In this embodiment, one third circuit layer 123 is schematically illustrated, but the disclosure does not specifically limit the number of the third circuit layer 123. That is, in some embodiments, the third circuit layer may be omitted based on the needs. In such case, the first circuit layer can be electrically connected to the second circuit layer (not shown) merely through a conductive via. In some embodiments, a multi-layered third circuit layer may be provided as needed, so that the first circuit layer can be electrically connected to the second circuit layer through conductive vias and the multi-layered third circuit layer.

In this embodiment, the material of the dielectric material layer 110 may be an organic dielectric material or an inorganic dielectric material. For example, the organic dielectric material may be benzocyclobutene (BCB), polyimide (PI), Ajinomoto Build-up Film (ABF), or other similar materials; the inorganic dielectric material may be, for example, aluminium nitride, an oxide layer or other similar materials, but the disclosure is not limited to thereto.

In this embodiment, providing the interlayer 100 may include the following. However, the disclosure is not limited thereto. First, a wafer (not shown) or a glass substrate (not shown) is provided as a temporary substrate. Next, the interlayer 100 in which the redistribution layer 120 is embedded is formed on the wafer or the glass substrate. The second surface 104 of the interlayer 100 faces the wafer or the glass substrate. Then, the wafer or the glass substrate is removed to expose the second surface 104 of the interlayer 100.

Then, referring to FIG. 1B, a first wafer 200 and a second wafer 300 are provided. Specifically, the first wafer 200 of this embodiment has a front surface 202 and a back surface 204 opposite to the front surface 202. The first wafer 200 includes a substrate structure 210, a dielectric layer 220 and multiple first conductive contacts 230. The substrate structure 210 is adjacent to the back surface 204. The substrate structure 210 may include a substrate (for example, a silicon substrate), a doped region, an electrode, a dielectric layer, a first semiconductor device, an interconnection device, or a combination thereof (not shown), but the disclosure is not limited to thereto. People of ordinary skills in the art may adjust the configuration of the substrate structure 210 according to product requirements. The dielectric layer 220 is formed on the substrate structure 210 and adjacent to the front surface 202. The material of the dielectric layer 220 may be an oxide layer (such as silicon oxide) or polysilicon, but the disclosure is not limited to thereto. In some embodiments, the material of the dielectric layer 220 may be different from the material of the dielectric material layer 110. In this embodiment, the first conductive contact 230 may be a columnar metal (for example, a copper column) or a pad protruding from the first wafer 200, and the first conductive contact 230 is not a solder bump or a solder ball not requiring reflow. In this way, the pitch between the adjacent first conductive contacts 230 and/or the height of the first conductive contacts 230 can be reduced, thereby reducing the package size of the wafer stacking structure 10 and meeting the demand for miniaturization. The first conductive contact 230 is disposed in the dielectric layer 220 and extends to protrude from the front surface 202 of the first wafer 200. The first conductive contact 230 may be electrically connected to a circuit device such as the semiconductor device or the interconnection device of the substrate structure 210.

In this embodiment, the second wafer 300 has a front surface 302 and a back surface 304 opposite to the front surface 302. In detail, the second wafer 300 includes a substrate structure 310, a dielectric layer 320, and multiple second conductive contacts 330. The substrate structure 310 is adjacent to the back surface 304. The substrate structure 310 may include a substrate (for example, a silicon substrate), a doped region, an electrode, a dielectric layer, a second semiconductor device, an interconnection device, or a combination thereof (not shown), but the disclosure is not limited to thereto. People of ordinary skills in the art may adjust the configuration of the substrate structure 310 according to product requirements. The dielectric layer 320 is formed on the substrate structure 310 and adjacent to the front surface 302. The material of the dielectric layer 320 may be an oxide layer (such as silicon oxide) or polysilicon, but the disclosure is not limited to thereto. In some embodiments, the material of the dielectric layer 320 may be different from the material of the dielectric material layer 110. The second conductive contact 330 may be a columnar metal (for example, a copper pillar) or a pad protruding from the second wafer 300, and the second conductive contact 330 is not a solder bump. The second conductive contact 330 may be disposed in the dielectric layer 220 and extend to protrude from the front surface 202 of the second wafer 300. The second conductive contact 330 may be electrically connected to a circuit device such as the semiconductor device or the interconnection device of the substrate structure 310.

In this embodiment, the first semiconductor device of the first wafer 200 and the second semiconductor device of the second wafer 300 may perform different functions respectively. For example, the first semiconductor device may be, for example, a random access memory (RAM), and the second semiconductor device may be, for example, a logic chip. However, the disclosure is not limited thereto. That is, in some embodiments, the first semiconductor device may be a logic chip, and the second semiconductor device may be a memory.

Referring to FIG. 1B again, multiple openings OP1 are formed on the first surface 102 of the interlayer 100 to expose a portion of the first circuit layer 121 in the redistribution layer 120, and multiple openings OP2 are formed on the second surface 104 of the interlayer 100 to expose a portion of the second circuit layer 122 in the redistribution layer 120. Specifically, the interlayer 100 includes the openings OP1 and the openings OP2. The openings OP1 are disposed on the first surface 102 of the interlayer 100, and the openings OP2 are disposed on the second surface 104 of the interlayer 100. Each of the openings OP1 may be respectively arranged corresponding to the first conductive contacts 230 of the first wafer 200. Thus, the first conductive contacts 230 may contact the first circuit layer 121 through the corresponding openings OP1 in a subsequent step. Each of the openings OP2 may be respectively arranged corresponding to the second conductive contacts 330 of the second wafer 300. Thus, the second conductive contacts 330 may contact the second circuit layer 122 through the corresponding openings OP2 in a subsequent step. In addition, in this embodiment, a process for forming the openings OP1 and the openings OP2 may be, for example, a photolithography process, but the disclosure is not limited to thereto.

Then, referring to FIGS. 1B and 1C, the first wafer 200 is bonded to the first surface 102 of the interlayer 100, and the second wafer 300 is bonded to the second surface 104 of the interlayer 100. Accordingly, the second wafer 300 may be electrically connected to the first wafer 200 through the redistribution layer 120 of the interlayer 100. In detail, the first conductive contacts 230 of the first wafer 200 may contact the first circuit layer 121 of the redistribution layer 120 through the openings OP1, and the second conductive contacts 330 of the second wafer 300 may contact the second circuit layer 122 of the redistribution layer 120 through the openings OP2. Thereby, the front surface 202 of the first wafer 200 and the front surface 302 of the second wafer 300 may respectively contact the first surface 102 and the second surface 104 of the interlayer 100, and the first wafer 200 and the second surface 104 may be respectively disposed on opposite sides of the interlayer 100.

In this embodiment, since the first conductive contacts 230 and the second conductive contacts 330 may be electrically connected through the redistribution layer 120 of the interlayer 100, at least one of the first conductive contacts 230 may not overlap with at least one of the second conductive contacts 330 in the normal direction (direction Y) of the wafer stacking structure 10. In addition, compared to the conventional wafer stack structure where the interlayer is not provided and the two wafers must be bonded in a pin-to-pin manner (i.e., the first conductive contacts of the first wafer need to be aligned and overlapped with the corresponding second conductive contacts in the second wafer), the wafer stacking structure 10 of this embodiment may be rewired through the redistribution layer 120 of the interlayer 100 to electrically connect the first conductive contact 230 and the second conductive contact 330 through the redistribution layer 120, thereby omitting the process of pin-to-pin bonding, simplifying the manufacturing process or increasing the manufacturing yield. In this way, wafers manufactured by different foundries can also be easily applied to the wafer stacking structure 10 of this embodiment.

In this embodiment, by disposing the interlayer 100 between the first wafer 200 and the second wafer 300, not only can the wafer stacking structure 10 have a favorable heat dissipation effect, the interlayer 100 may also be used as a stress buffer layer to reduce the stress generated when the first wafer 200 is stacked on the second wafer 300.

In this embodiment, the first wafer 200, the interlayer 100, and the second wafer 300 may be stacked and integrated vertically, and the first wafer 200, the interlayer 100, and the second wafer 300 can overlap in the normal direction (direction Y) of the wafer stacking structure 10. In this way, the first semiconductor device in the first wafer 200 may be electrically connected to the second semiconductor device in the second wafer 300 via the first conductive contacts 230, the redistribution layer 120, and the second conductive contacts 330. Therefore, compared to the conventional package structure in which two chips are arranged horizontally, the wafer stack structure 10 of this embodiment can shorten the electrical transmission path between the first wafer 200 and the second wafer 300 to reduce power consumption, the manufacturing process can also be simplified to facilitate the manufacturing yield.

In this embodiment, the first wafer 200 and the second wafer 300 are bonded in a face-to-face manner, that is, the front surface 202 of the first wafer 200 is arranged to face the front surface 302 of the second wafer 300, but the disclosure is not limited to this. In some embodiments, the first wafer 200 and the second wafer 300 may also be bonded in a face-to-back manner, for example, such as arranging the back surface 204 of the first wafer 200 to face the front surface 302 of the second wafer 300 (not shown). So far, the manufacture of the wafer stack structure 10 of this embodiment is completed.

Other embodiments will be described in the following. The following embodiments use the reference numerals and some of the contents of the foregoing embodiments, where the same numbers are used to represent the same or similar components, and the description of the same technical content is omitted. For the description of the omitted parts, reference is made to the foregoing embodiments, and the same description will not be repeated in the following embodiments.

Figure 2A:
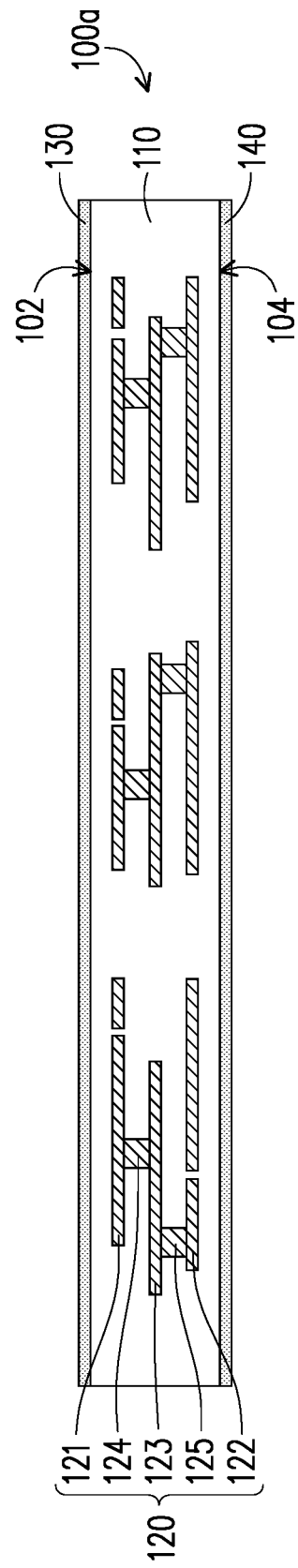
FIG. 2A to FIG. 2C are schematic cross-sectional views illustrating a method for manufacturing a wafer stacking structure according to another embodiment of the disclosure.
Figure 2B:
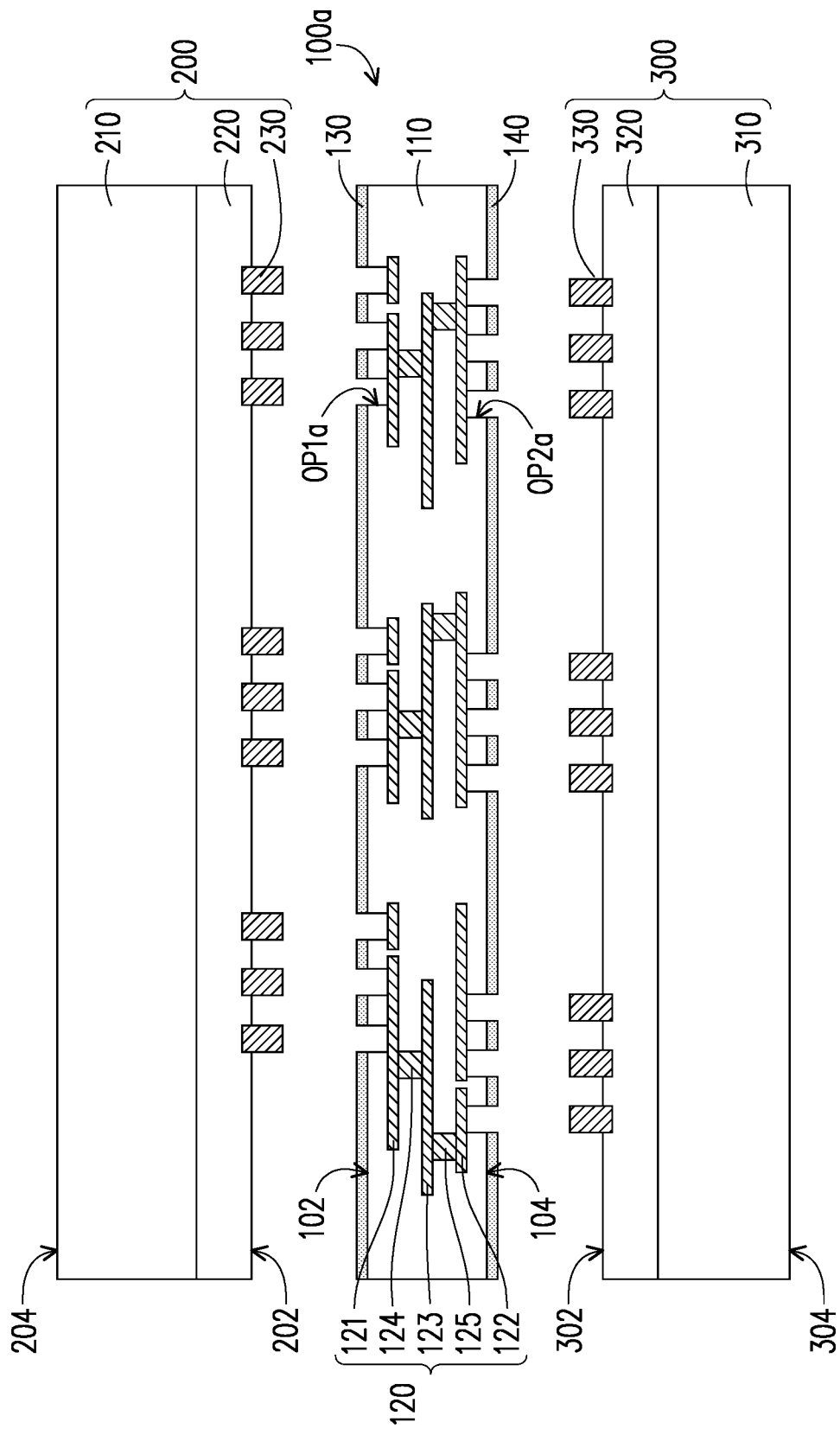
Figure 2C:
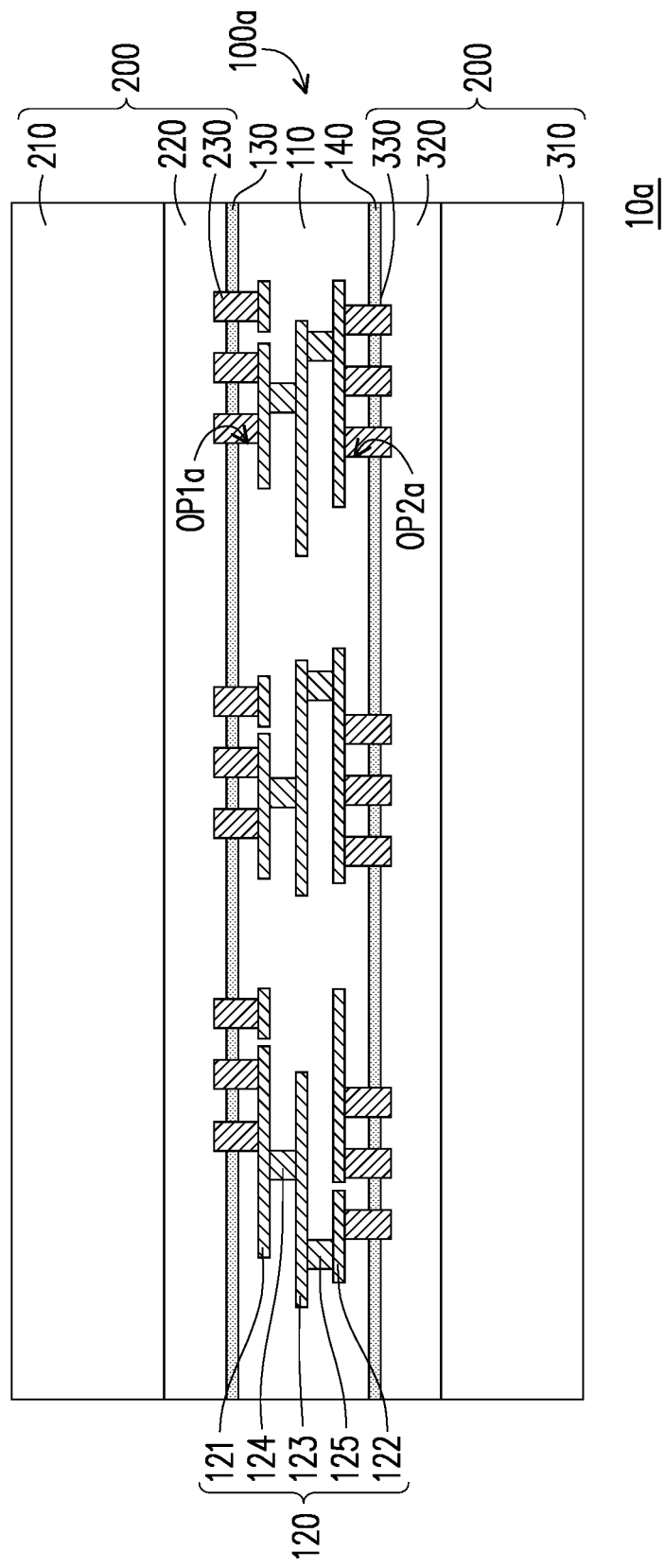

FIGS. 2A to 2C are schematic cross-sectional views illustrating a method for manufacturing a wafer stacking structure according to another embodiment of the disclosure. The embodiment shown in FIGS. 2A to 2C is similar to the embodiment shown in FIGS. 1A to 1C. Therefore, the same components are denoted by the same reference numerals, and the detailed content thereof will not be repeated. The difference between the embodiment shown in FIGS. 2A to 2C and the first embodiment shown in FIGS. 1A to 1C is that a wafer stacking structure 10a of this embodiment further includes a first adhesive layer 130 and a second adhesive layer 140.

Specifically, referring to FIG. 2A, compared with FIG. 1A, the manufacturing method of the wafer stack structure 10a of this embodiment further includes the following steps: forming the first adhesive layer 130 on the first surface 102 of an interlayer 100a, and forming the second adhesive layer 140 on the second surface 104 of the interlayer 100a.

Next, referring to FIG. 2B, compared with FIG. 1B, in the manufacturing method of the wafer stacking structure 10a of this embodiment, a photolithography process, for example, is performed to etch the first adhesive layer 130, the second adhesive layer 140, and the electrical material layer 110 to form multiple openings OP1a and multiple openings OP2a. The openings OP1 may expose a portion of the first circuit layer 121 in the redistribution layer 120, and the openings OP2 may expose a portion of the second circuit layer 122 in the redistribution layer 120.

Next, referring to FIGS. 2B and 2C, compared with FIGS. 1B and 1C, in the manufacturing method of the wafer stacking structure 10a of this embodiment, the first conductive contacts 230 of the first wafer 200 may be brought into contact with and bonded to the first circuit layer 121 of the redistribution layer 120 through the openings OP1a, and the second conductive contacts 330 of the second wafer 300 may be brought into contact with and bonded to the second circuit layer 122 of the redistribution layer 120 through the openings OP2a. Since the first adhesive layer 130 is disposed between the front surface 202 of the first wafer 200 and the first surface 102 of the interlayer 100a, and the second adhesive layer 140 is disposed between the front surface 302 of the second wafer 300 and the second surface 104 of the interlayer 100a, the adhesion between the first wafer 200 and the interlayer 100a may be increased, and the adhesion between the second wafer 300 and the interlayer 100a may be increased.

Figure 3:
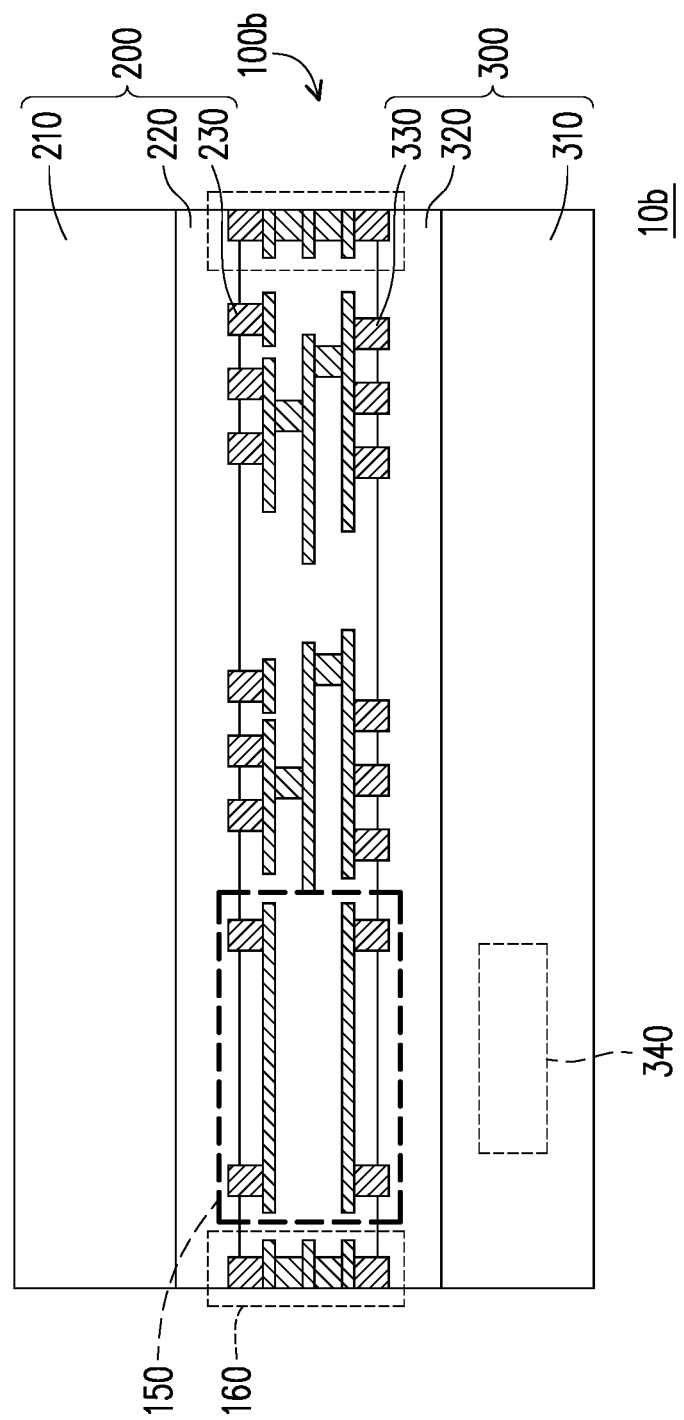
FIG. 3 is a schematic cross-sectional view of a wafer stacking structure according to yet another embodiment of the disclosure.

FIG. 3 is a schematic cross-sectional view illustrating a wafer stacking structure according to yet another embodiment of the disclosure. Please refer to the FIG. 1C and FIG. 3 at the same time. A wafer stacking structure 10b of this embodiment is similar to the wafer stacking structure 10 in FIG. 1C, but wafer stacking structure 10b of the embodiment mainly differs in that, an interlayer 100b further includes a shielding structure 150 and an antenna structure 160.

Specifically, referring to FIG. 3, in this embodiment, the second wafer 300 may further include a radio frequency circuit 340. Therefore, in order to prevent the radiation signal emitted by the radio frequency circuit 340 from interfering with the first wafer 200, the shielding structure 150 is also provided in this embodiment. Since the shielding structure 150 embedded in the interlayer 100b may be disposed corresponding to the radio frequency circuit 340 and grounded, the shielding structure 150 may be used to shield the radiation signal emitted from the radio frequency circuit 340 of the second wafer 300 for electromagnetic interference (EMI) shielding. In this embodiment, in order to make the wafer stacking structure 10b applicable to radio frequency or 5G communication, etc., the antenna structure 160 is also provided on the side of the interlayer 100b for transmitting and/or receiving signals.

In addition, in some embodiments, since the shielding structure 150 may also be electrically connected to the first wafer 200 and the second wafer 300, respectively, the first wafer 200 may be grounded through the shielding structure 150, and the second wafer 300 may be grounded through the shielding structure 150. In other words, the shielding structure 150 may form a common ground structure with the first wafer 200 and the second wafer 300.

In summary, in the wafer stacking structure and the manufacturing method of the wafer stacking structure according to the embodiments of the disclosure, the first wafer is disposed on the first surface of the interlayer, the second wafer is disposed on the second surface of the interlayer, and the second wafer is electrically connected to the first wafer through the redistribution layer of the interlayer. Therefore, the electrical transmission path between the first wafer and the second wafer can be shortened, the power consumption of the wafer stacking structure of the embodiments can be reduced, and the manufacturing process and the manufacturing yield according to the manufacturing method of the wafer stacking structure of the embodiments can be respectively simplified and increased. In addition, by disposing the interlayer between the first wafer and the second wafer, not only can the wafer stacking structure have a favorable heat dissipation effect, the interlayer may also be used as a stress buffer layer to reduce the stress generated when the first wafer is stacked on the second wafer. In addition, through the rewiring of the redistribution layer of the interlayer, the first conductive contact and the second conductive contact may be electrically connected through the redistribution layer. Accordingly, the process of pin-to-pin bonding can be omitted, and the manufacturing process can be simplified or the manufacturing yield can be increased.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A wafer stacking structure comprising:
an interlayer having a first surface and a second surface opposite to the first surface and comprising a dielectric material layer and a redistribution layer embedded in the dielectric material layer;
a first wafer disposed on the first surface of the interlayer, wherein the first wafer comprises a plurality of first conductive contacts, and the first conductive contacts contact the redistribution layer; and
a second wafer disposed on the second surface of the interlayer, wherein the second wafer comprises a plurality of second conductive contacts, and the second conductive contacts contact the redistribution layer,
wherein the second wafer is electrically connected to the first wafer through the redistribution layer of the interlayer, the first conductive contacts are columnar metals protruding from the first wafer, and the second conductive contacts are columnar metals protruding from the second wafer,
wherein each of the first conductive contacts does not overlap with anyone of the second contacts in a normal direction of the wafer stacking structure,
wherein the interlayer further comprises a shielding structure and an antenna structure, the shielding structure is embedded in the interlayer to shield a radiation signal from the second wafer, and the antenna structure is disposed on a side of the interlayer to emit and/or receive a signal.

2. The wafer stacking structure according to claim 1, wherein the interlayer further comprises a plurality of openings disposed on the first surface and the second surface to expose the redistribution layer.

3. The wafer stacking structure described in claim 1, wherein the redistribution layer comprises a first circuit layer, a second circuit layer, and a plurality of conductive vias, the first circuit layer contacts the first conductive contacts, the second circuit layer contacts the second conductive contacts, and the conductive vias are electrically connected to the first circuit layer and the second circuit layer.

4. The wafer stacking structure according to claim 1, wherein the second wafer, the interlayer and the first wafer overlap in a normal direction of the wafer stacking structure.

5. The wafer stacking structure according to claim 1, wherein a material of the first wafer and the second wafer is different from a material of the dielectric material layer.

6. The wafer stacking structure according to claim 5, wherein the material of the dielectric material layer is an organic or inorganic dielectric material.

7. The wafer stacking structure according to claim 5, wherein the material of the dielectric material layer is aluminium nitride, benzocyclobutene, polyimide, or Ajinomoto build-up film.

8. The wafer stacking structure according to claim 1, further comprising:
a first adhesive layer disposed between the first wafer and the first surface of the interlayer; and
a second adhesive layer is disposed between the second wafer and the second surface of the interlayer.

9. The wafer stacking structure according to claim 1, wherein the shielding structure is grounded, and the shielding structure forms a common ground structure with the first wafer and the second wafer.

10. A manufacturing method of a wafer stacking structure comprises:
providing an interlayer, wherein the interlayer has a first surface and a second surface opposite to the first surface, and the interlayer comprises a dielectric material layer and a redistribution layer embedded in the dielectric material layer;
bonding a first wafer to the first surface of the interlayer, wherein the first wafer comprises a plurality of first conductive contacts, and the first conductive contacts contact the redistribution layer; and
bonding a second wafer to the second surface of the interlayer, so that the second wafer is electrically connected to the first wafer through the redistribution layer of the interlayer, wherein the second wafer comprises a plurality of second conductive contacts, and the second conductive contacts contact the redistribution layer,
wherein the first conductive contacts are columnar metals protruding from the first wafer, and the second conductive contacts are columnar metals protruding from the second wafer,
wherein each of the first conductive contacts does not overlap with anyone of the second contacts in a normal direction of the wafer stacking structure,
wherein the interlayer further comprises a shielding structure and an antenna structure, the shielding structure is embedded in the interlayer to shield a radiation signal from the second wafer, and the antenna structure is disposed on a side of the interlayer to emit and/or receive a signal.

11. The method for manufacturing the wafer stacking structure according to claim 10, wherein providing the interlayer comprises:
providing a wafer or a glass substrate;
forming the interlayer on the wafer or the glass substrate; and
removing the wafer or the glass substrate to expose the second surface of the interlayer.

12. The method for manufacturing the wafer stacking structure according to claim 10, wherein bonding the first wafer to the first surface of the interlayer comprises:
forming a plurality of openings on the first surface of the interlayer to expose the redistribution layer; and
making the first conductive contacts of the first wafer contact the distribution layer through the openings.

13. The method for manufacturing the wafer stacking structure according to claim 10, wherein bonding the second wafer to the second surface of the interlayer comprises:
forming a plurality of openings on the second surface of the interlayer to expose the redistribution layer;
making the second conductive contacts of the second wafer contact the redistribution layer through the openings.

14. The manufacturing method of the wafer stacking structure according to claim 10 further comprises:
forming a first adhesive layer between the first wafer and the first surface of the interlayer; and
forming a second adhesive layer between the second wafer and the second surface of the interlayer.

* * * * *